(12) United States Patent
Graf et al.

(10) Patent No.: US 7,004,716 B2
(45) Date of Patent: Feb. 28, 2006

(54) DEVICE AND METHOD FOR ALIGNING DISK-SHAPED SUBSTRATES

(75) Inventors: Ottmar Graf, Bergatreute (DE); Paul Mantz, Ehingen (DE)

(73) Assignee: Steag RTP Systems GmbH, Dornstadt (DE)

( * ) Notice: Subject to any disclaimer, the term of this patent is extended or adjusted under 35 U.S.C. 154(b) by 106 days.

(21) Appl. No.: 10/148,656

(22) PCT Filed: Nov. 29, 2000

(86) PCT No.: PCT/EP00/11955

§ 371 (c)(1),
(2), (4) Date: May 30, 2002

(87) PCT Pub. No.: WO01/41193

PCT Pub. Date: Jun. 7, 2001

(65) Prior Publication Data

US 2002/0172585 A1    Nov. 21, 2002

(30) Foreign Application Priority Data

Dec. 1, 1999 (DE) ................................ 199 57 758

(51) Int. Cl.
*B25J 11/00*    (2006.01)
(52) U.S. Cl. .................. 414/754; 414/757; 414/936
(58) Field of Classification Search ............. 414/433, 414/754, 757, 778, 936; 148/395, 409
See application file for complete search history.

(56) References Cited

U.S. PATENT DOCUMENTS

| 3,982,627 | A |   | 9/1976  | Isohata |
|-----------|---|---|---------|---------|
| 3,993,018 | A |   | 11/1976 | Kranik et al. |
| 4,887,904 | A | * | 12/1989 | Nakazato et al. ........... 356/375 |
| 5,183,378 | A |   | 2/1993  | Asano et al. |
| 5,848,670 | A |   | 12/1998 | Salzman |
| 6,116,848 | A |   | 9/2000  | Thomas et al. |

FOREIGN PATENT DOCUMENTS

DE    3506782    10/1985

OTHER PUBLICATIONS

Japanese 60057948, one page Abstract & drawing, Apr. 1985.*
JP 04 157752 , Patent Abstracts of Japan.
JP 60057948, Patent Abstracts of Japan.

* cited by examiner

*Primary Examiner*—Donald W. Underwood
(74) *Attorney, Agent, or Firm*—Dority & Manning, P.A.

(57) ABSTRACT

The invention relates to a simple and cost-effective method for aligning substrates. In order to achieve this, the invention provides a device for aligning disc-shaped substrates, in particular semiconductor wafers, comprising an alignment detection unit, at least one first support for receiving the substrate, which forms an oblique plane in relation to the horizontal, a stop against which the substrate can be displaced as a result of the oblique angle and a rotational device for rotating the substrate. The invention also relates to a method for aligning disc-shaped substrates, in particular semiconductor wafers, comprising the following steps: displacement of the substrate into an oblique position in relation to the horizontal, in which the substrate is held on a support which forms a tilted plane in relation to the horizontal and lies against a stop as a result of the oblique angle; rotation of the substrate into a predefined rotational position; and monitoring of the rotational position using a detection unit.

35 Claims, 5 Drawing Sheets

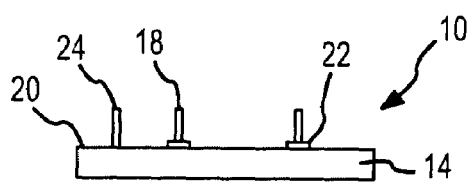 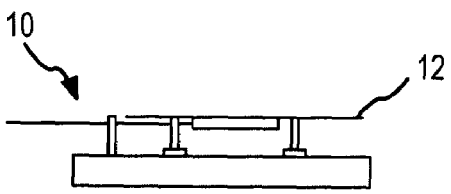
FIG.1a          FIG.2a
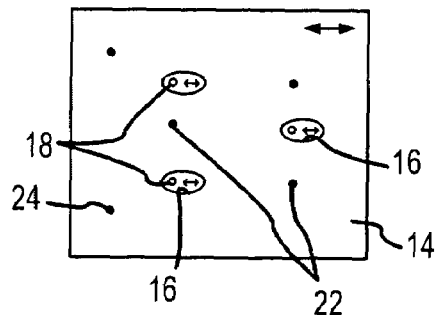 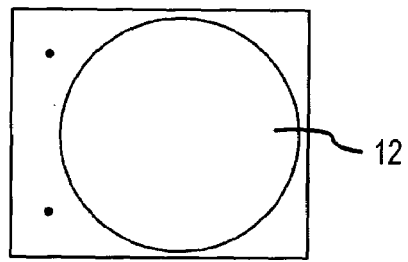
FIG.1b          FIG.2b
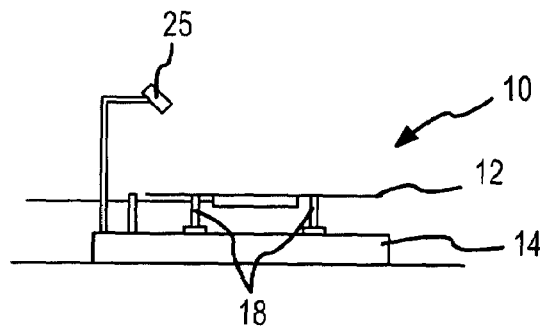
FIG.3
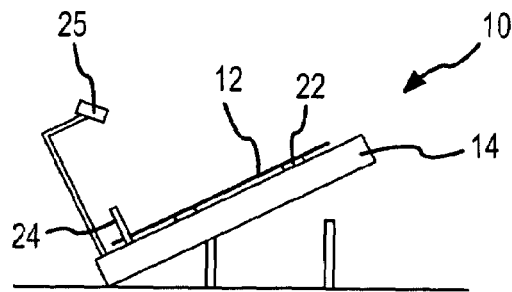
FIG.4

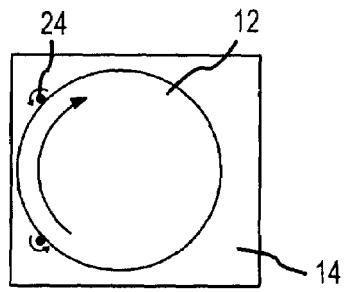
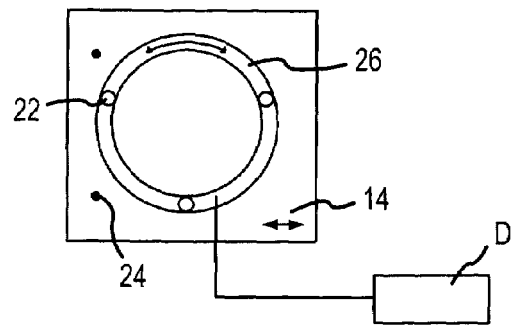
FIG.5a  FIG.5b
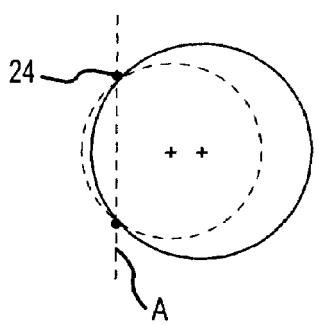
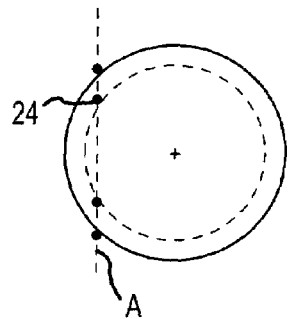
FIG.6  FIG.7
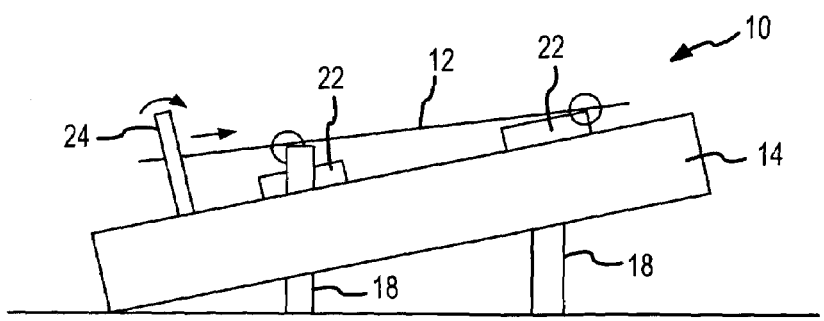
FIG.8

DEVICE AND METHOD FOR ALIGNING DISK-SHAPED SUBSTRATES

BACKGROUND OF THE INVENTION

The present invention relates to an apparatus and a method for the alignment of disk-shaped substrates, especially semiconductor wafers, and includes an alignment detection unit.

In the semiconductor industry, to manufacture semiconductor elements generally semiconductor disks, also known as wafers, that are comprised of a single crystal, are subjected to various treatment processes. These treatment processes are greatly automated, and between the treatment processes the semiconductor disks are transported with handling devices, which are generally support plates. In this connection, a centered placement of the disks upon the support plates is important in order to ensure a proper positioning of the disks in the various treatment devices. In addition, the disks must be aligned in accordance with the axes of their crystal lattices. Both the centering as well as the alignment of the disks is undertaken by alignment apparatus, which are also designated as aligners.

With one known aligner, which is shown by way of example in FIGS. 11a–d, a semiconductor disk 1 is deposited by a handling device 2 upon support pins 3 of the aligner. The handling device is subsequently moved out of the region below the wafer and the pins 3 are lowered, as a result of which the disk is positioned upon the rotary turntable 4, which is designated as a chuck. The rotary turntable 4 is provided with an underpressure suction device in order to securely hold the disk thereon. If the disk 1 is attached by suction, the rotary table 4 is rotated about its axis of rotation. During this rotation, a lateral displacement of the disk relative to the axis of rotation is measured with a camera 5. The pins 3 are again raised in order to raise the semiconductor disk 1 from the rotary table 4, and the pins are moved in a horizontal direction as a function of the measured displacement in order to center the disk relative to the rotary table 4. Subsequently, the disk is again deposited upon the rotary turntable 4 in order to repeat the above measurement process and to ensure that the disk 1 is now centered relative to the rotary turntable 4. This process is repeated until a complete centering is achieved.

In addition to the measurement of the lateral displacement, the camera 5 is in a position to recognize a marking in the form of a recess, which is also known as a notch, or to recognize a flattened portion of the edge of the disk 1, which is also known as a flat, with the notch or flat providing the crystal direction of the disk. After the aforementioned centering, the rotary turntable 4 is rotated in a desired direction in order to bring the marking into a predetermined position. The positioning is monitored by the camera, which then also simultaneously reads the ID number that is formed in the semiconductor disk and that has, for example, the form of a barcode or a number sequence.

The alignment process described above is very complicated and expensive, and since it includes a plurality of steps that are to be repeated, it is also very time intensive, which results in a very low throughput. Furthermore, a comprehensive software is necessary for the control of the various elements, and also a suction device is necessary for holding the disks on the rotary turntable, which unnecessarily increases the cost for the apparatus.

Due to mechanical movements of motors or other components of the unit, resonance effects that produce vibrations can occur, due to which a disk that rests upon the pins can be shifted and can thus influence the centering. A further problem results due to the suction of the wafer against the rotary turntable, since as a consequence dust particles that are in the environment can be suctioned on and which collect on the surface of the wafer over a large surface area thereof in the region of the suction openings, as shown in FIGS. 12a and 12b.

Contaminations of this type can, however, greatly adversely affect the usability of the semiconductor disk.

FIG. 12a shows the underside of a semiconductor disk 1 before it is suctioned onto a rotary turntable, and FIG. 12b shows the surface of the wafer after the suctioning onto the rotary turntable. As can be seen in FIG. 12a, a small amount of contamination is found on the underside of the wafer and is distributed over the entire surface. However, as can be recognized in FIG. 12b, due to the suctioning of the semiconductor disk a large number of particles collect on the underside, and in particular in the region in which the suction device of the rotary turntable suctions the disk 1.

DE-A-35 06 782 discloses an apparatus for the alignment of the edges of a wafer, according to which the wafer is again positioned on a rotary turntable. The rotary turntable has an underpressure suction device in order to securely hold the disk thereon. During the time that the disk is suctioned on, the rotary turntable is rotated about its axis of rotation, and a lateral displacement of the disk relative to the axis of rotation is measured with the aid of a series of photo detectors in order to be utilized for the subsequent centering of the wafer.

U.S. Pat. No. 3,982,627 describes an apparatus for the automatic alignment of a wafer, according to which the wafer is placed upon an inclined support. Due to the incline, the wafer slides against a rotatable abutment. For the alignment of the wafer, the rotatable abutment, and hence the wafer, are rotated until the wafer achieves a desired position. During the rotation of the wafer, it is held spaced from the support via an air cushion.

Proceeding from the previously described apparatus, it is an object of the present invention to provide an apparatus and a method for the alignment of disk-shaped substrates, in particular semiconductor wafers, which use an alignment detection unit and which, in a simple and economical manner, enable an alignment of the substrate and permit a simple integration into existing wafer treatment units. In this connection, an alignment involves not only a spatial arrangement but also a certain rotational arrangement of the substrate.

SUMMARY OF THE INVENTION

Pursuant to the invention, this object is realized with an apparatus of the aforementioned type by means of at least one movable first support, which forms a support plane, for receiving the substrate, a device for tilting the first support relative to the horizontal in order to bring the support plane into an inclined position relative to the horizontal, an abutment against which the substrate is movable due to the incline, and a rotation device for rotating the substrate. The movable first support enables a depositing and a removal of the substrate in an essentially horizontal position as a result of which the apparatus can be easily integrated into existing systems in which handling devices generally hold the substrates in horizontal positions. It is therefore not necessary to alter the previously used handling devices. Due to the inclined support, the substrate is automatically moved into a spatially fixed position against the abutment. Due to the rotation device, the substrate can now be moved into a prescribed rotated position, which is detected by the alignment detection unit. The positioning and alignment are effected in a single step and require no complicated control of various elements. Therefore, a suctioning of the substrate is not required, since a lateral sliding during the rotation is not possible due to the inclined position and the abutment. As a result, the cost and problems associated with the suction device are eliminated.

The first support preferably has at least two first support elements that form the plane and that enable as free a movement as possible of the handling device for the loading and removal of the substrate. In this connection, preferably three first support elements, which form a three-point support, are provided. In order during a relative movement between the support elements and the substrate to prevent damage to the substrate and to prevent the production of particles, the support elements, at least in the support region, are provided with a material having low friction, especially Teflon. Damage to the substrate during a relative movement between the support elements and the substrate can preferably also be avoided by rounding off the support region of the support elements.

For a good guidance and to avoid a relative movement between the substrate and the abutment during the tilting of the first support, the abutment is preferably also tiltable. The abutment preferably has at least two abutment pins that are spaced from one another in order to at least partially receive the substrate therebetween and to ensure a fixed spatial positioning of the substrate.

Pursuant to a particularly preferred embodiment of the invention, at least one of the abutment pins is rotatable, as a result of which the substrate resting thereagainst can be rotated in a particularly straightforward manner. For a good and uniform rotation of the substrate, and to avoid relative movements between the abutment pins and the substrate, the abutment pins are preferably rotatable synchronously relative to one another. This is preferably achieved by means of a common drive element, such as, for example, a common drive belt that is in engagement with the abutment pins.

In order to enable a precise alignment of in particular a crystal direction of the substrate, the rotation device can be controlled as a function of an alignment determined by the detection unit.

Pursuant to a particularly preferred embodiment of the invention, the support elements and/or the abutment pins are disposed on a common plate, which is preferably tiltable.

Pursuant to a further embodiment of the invention, the apparatus has a second support, which forms an essentially horizontal plane, for receiving the substrate. In this connection, the first and the second supports are preferably movable relative to one another in order to transport the substrate from one support to the other, and to bring the substrate in particular out of a horizontal position into an inclined position. The second support preferably has at least two second support elements that form the horizontal plane and that preferably have rounded support surfaces in order during a relative movement between substrate and support elements to avoid damage to the substrate against edges of the support elements.

Pursuant to a straightforward embodiment of the invention, the second support elements are embodied to be stationary. In this connection, the second support elements preferably extend through openings in the plate on which the first support elements and/or abutment pins are mounted.

Pursuant to an alternative embodiment, the second support elements are movable with the plate and relative to it in order during the tilting of the plate to enable a transfer of the substrate from the second support elements to the first support elements and vice versa, with as low a level of relative movement as possible between the substrate and the second support elements. Furthermore, in this way it is possible to achieve that the support surfaces of the second support elements always extend essentially parallel to a support surface of the substrate. In this connection, the support elements are preferably biased in a direction away from the substrate.

In order to enable an automatic adaptation of the alignment apparatus to substrates having different diameters, the apparatus is preferably provided with a device for measuring the substrate diameter. The spacing between the abutment pins is preferably adjustable as a function of the substrate diameter in order in this way to achieve a precise positioning of the center point of the substrate that remains uniform for substrates having different diameters.

Pursuant to one embodiment of the invention, in order to provide a rotation of the substrate the first support elements are rotatable about a common center point that preferably coincides with the center point of the wafer. Due to a rotation of the first support elements, a relative movement between the substrates and the support elements is avoided during the rotation, thereby reducing the danger of damage to the substrate. In this connection, the first support elements are preferably disposed on a rotatable element.

Where substrates having different substrate diameters are present, the center point of the substrate is positioned in different locations during the alignment to the extent that a uniform positioning of the center point via an adjustment of the abutment pins as a function of the substrate diameter is not effected. In order therefore to ensure a centered accommodation of the substrate upon a substrate-handling device after the alignment, pursuant to one embodiment of the invention the movement of the handling device is controlled as a function of the substrate diameter.

Pursuant to a further embodiment of the invention, a centering between substrate and handling device is achieved by a unit for the synchronous movement of the first or second support as a function of the substrate diameter. In so doing, after the tilting back of the first support a precise positioning of the substrate center point, which remains uniform for substrates having different diameters, is achieved so that a special control of the handling device is eliminated.

The object of the present invention is also realized by a method of aligning disk-shaped substrates, in particular semiconductor wafers, by depositing the substrate upon an alignment apparatus, moving, especially tilting, a movable first support of the alignment apparatus into a position that is inclined relative to the horizontal in order to bring the substrate into a position that is inclined relative to the horizontal and due to the incline to bring the substrate against at least one abutment, and rotating the substrate into a predetermined rotated positioned that is monitored by a detection unit. This results in the advantages already mentioned in conjunction with the apparatus, and in particular a straightforward and economical alignment of sustrates in a time saving, single sequence of steps. By moving, especially tilting, the support, the substrate can initially be deposited on the alignment apparatus in an essentially horizontal position, as was the case with the previous apparatus. This results in a good compatibility of the inventive method with existing substrate-handling devices for the transport of the substrate.

To ensure a good guidance of the substrate, and to reduce a relative movement between the substrate and other elements, the support and the abutment are preferably moved in common.

For a simple rotation of the substrate, it is preferably rotated by rotating at least one abutment element of the abutment. In this connection, for as uniform a rotation as possible, preferably two spaced-apart abutment elements are rotated.

The rotation of the substrate is preferably controlled as a function of an alignment of the substrate determined by the detection unit in order to ensure a proper and precise positioning of the substrate in the direction of rotation.

The diameter of the substrate is advantageously determined, and pursuant to a preferred embodiment of the invention the spacing between the abutment elements is adjusted as a function of the diameter. This enables a precise and uniform positioning of a center point of the substrate independently of its diameter. In order to avoid a relative movement between the substrate and the support, the substrate is preferably rotated by means of a rotation of the support.

Pursuant to one embodiment of the invention, the movement of a substrate-handling device is controlled as a function of the diameter of the substrate in order to ensure a centered accommodation of the substrate. Pursuant to a further embodiment, the centered accommodation is achieved by synchronously moving the support elements of the first or of the second support in one direction, as a function of the substrate diameter, after the tilting back of the first support.

BRIEF DESCRIPTION OF THE DRAWINGS

Further features, advantages and details of the invention will be explained subsequently with the aid of embodiments with reference to the figures. The drawings show:

FIGS. 1a and b a schematic side view as well as a top view upon an apparatus pursuant to the present invention;

FIGS. 2a and b a schematic side view as well as a top view similar to FIG. 1, with a semiconductor wafer placed upon the apparatus;

FIG. 3 a schematic side view of the apparatus of FIG. 2a in a starting position;

FIG. 4 a schematic side view of the apparatus of FIG. 3 in a second, tilted position;

FIG. 5a a top view upon the apparatus in its tilted position;

FIG. 5b a top view of an embodiment of the inventive apparatus;

FIG. 6 a schematic illustration of semiconductor substrates having different diameters, as they rest against a non-movable abutment of the inventive apparatus;

FIG. 7 a schematic illustration of semiconductor wafers having different diameters, as they rest against a movable abutment pursuant to the inventive apparatus;

FIG. 8 an enlarged illustration of an inventive apparatus pursuant to FIG. 1;

DESCRIPTION OF THE PREFERRED EMBODIMENTS

Figure 9:
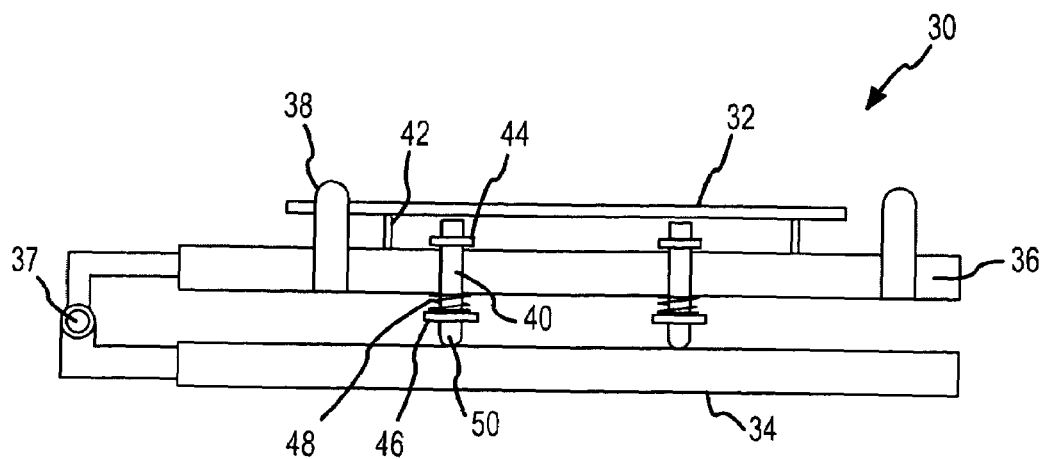
FIG. 9 a schematic side view of an alternative embodiment of an alignment apparatus pursuant to the present invention.

FIGS. 1a and 1b show a schematic side view and a top view respectively of an apparatus 10 for the alignment of disk-shaped semiconductor wafers 12 (see FIG. 2). The apparatus 10 has a plate 14 which, as will be described subsequently, can be tilted. The plate 14 has three oval openings 16 that extend upwardly from below through the plate 14. Three support pins 18 extend through the openings 16 in the plate 14 and are secured to a non-illustrated base plate. The support pins 18 form a three-point support having an essentially horizontal support plane for receiving the semiconductor wafer 12, as can be best seen in FIG. 2a. Disposed on an upper side 20 of the plate 14 are three Teflon disks 22 which, as will be described subsequently, serve as support elements for the semiconductor wafer 12 when the plate 14 is tilted relative to the horizontal. Instead of the three pins 18 and the three disks 22, it is also possible to respectively provide two elongated elements that form a support plane and permit a reliable support of the wafer.

Furthermore provided on the plate 14 are two rotatable abutment pins 24. The abutment pins 24 are rotatable via a non-illustrated drive mechanism, whereby the two pins are interconnected via a common drive belt to achieve a synchronous rotation of the two pins.

FIG. 3 shows a schematic side view of the apparatus 10 with a wafer 12 placed thereon in a starting position. The wafer 12 rests upon the support pins 18, and the plate 14 has a horizontal orientation.

FIG. 4 shows the apparatus 10 in a different position. The plate 14 is tilted relative to the horizontal, so that the wafer 12 no longer rests upon the stationary support pins 18, but rather upon the Teflon disks 22 and is therefore also in an inclined position. Due to the incline, and as a result of the fact that Teflon has a low frictional resistance, the wafer 12 slides against the abutment pins 24 and is centered between them, as can be best seen in the top view of FIG. 5. In this position, the abutment pins 24 are rotated in order to rotate the wafer 12 about its central axis, as can also be best seen in the top view of FIG. 5a. See also the drive means D in FIG. 5b.

It is known that semiconductor wafers generally have a mark, which is also known as a notch, or a flattened portion, which is also called a flat, with the aid of which the crystal direction of the wafer can be determined. The apparatus 10 has a sensor device 25, such as, for example, a camera or a CCD array or image sensor that is in the position to recognize a marking of the wafer and to determine the position thereof during the aforementioned rotation of the wafer about its central axis. In order to achieve a desired crystal alignment of the wafer 12, its rotation is controlled in such a way that the marking of the wafer is rotated into a predetermined position that is recognized by the sensor device 25. The rotation is therefore controlled with the aid of the position of the marking determined by the sensor device 25.

If the marking is in the predetermined position, the semiconductor wafer is aligned not only spatially but also relative to its crystal direction. The plate 14 is now tilted back, as a result of which the wafer 12 is again placed upon the support pins 18. The wafer 12 is now disposed in a precisely determined position upon the support pins 18 that is also aligned relative to its crystal direction. For the removal of the substrate 12, a substrate-handling device is moved under the wafer 12 in such a way that it receives the wafer in a centered manner and transports it away for the further processing.

With the previously described embodiment, the abutment pins 24 are locally fixed upon the plate 14. If semiconductor wafers having different diameters are placed upon the apparatus 10 and are subsequently aligned, the center point of the respective wafer is located at different positions, as can be seen from FIG. 6. With wafers having smaller diameters, the center point of the wafers approaches closer to a straight line A that passes through the abutment pins 24.

In order to precisely determine the diameter of the wafer, and hence its center point, after the orientation, a sensor device 25 for the measurement of the wafer diameter is provided. This function is carried out by the alignment sensor device 25, i.e., for example, by a camera or CCD array or image sensor. As shown in FIG. 5b, the sensor device 25 is connected to a pin alignment device 110 and a pin rotation drive device 112. The pin alignment device 110 can, for example, comprise a worm gear shaft and a motor for reversibly rotating the worm gear shaft. The worm gear shaft in such a configuration would meshingly engage a gear rotatably mounted to each of the abutment pins 24, whereby rotation of the worm gear shaft in one direction would effect movement of the pair of the abutment pins 24 away from one another so as to increase the spacing of the pair of the abutment pins 24 from one another while rotation of the worm gear shaft in an opposite direction would effect movement of the pair of the abutment pins 24 toward one another so as to decrease the spacing of the pair of the abutment pins 24 from one another. The operation of the pin alignment device 110 is controlled by appropriate software or other control systems as a function of the respective wafer diameter sensed by the sensor device 25, whereby the spacing of the pair of the abutment pins 24 from one another is thus controlled as function of the wafer diameter of the respective wafer abutting the abutment pins 24. The pins can, for example, comprise a drive pulley, a motor for drivingly rotating the drive pulley, a spring-biased idler pulley, and an endless belt trained around each of the abutment pins 24, the drive pulley, and the idler pulley.

The drive pulley of the pin is drivingly rotated by the motor of the pin, thereby driving the endless belt in a selected drive direction so as to effect rotation of each of the abutment pins 24 about its respective axis. The operation of the pin is controlled by appropriate software or other control systems as a function of the respective wafer position sensed by the sensor device 25, whereby the rotation of the abutment pins 24 is controlled to achieve a desired crystal alignment of the wafer 12. A length scale on the plate 14 is read by the camera or CCD array or image sensor, as a result of which the wafer diameter is known. The movement of the handling device for the removal of the semiconductor wafer is controlled as a function of the thus-determined diameter, so that it always receives the wafer in a precisely centered manner. Of course, other ways for determining the wafer diameter are also possible.

FIG. 7 schematically shows an alternative embodiment of the invention, according to which essentially the same components are provided as with the first embodiment. Instead of a pair of laterally fixed abutment pins 24, the abutment pins 24 are mounted on the plate 14 so as to be laterally movable. As a result of a lateral movement of the abutment pins 24 out of the first position shown in FIG. 7, which is illustrated by a filled-in point, to a second position, which is illustrated by a circle, it is possible to receive semiconductor wafers having different diameters in such a way that their center point always lies in the same position. For this purpose, it is again necessary to determine the diameter of the wafer and subsequently to move the abutment pins laterally so that the center point of the substrate rests upon a predetermined point. This results in the advantage that the substrate-handling device can always be moved into the same position, independently of the wafer diameter, in order to receive the wafer in a centered manner. Furthermore, this enables a centering of the wafer relative to the Teflon supports 22 independently of the wafer diameter. In this connection, it is possible to arrange the Teflon supports 22 in such a way that they lie upon a circle, the center point of which coincides with the center points of the wafers, as can be seen in FIG. 5a. Since the Teflon supports are disposed upon a rotatable element, such as, for example, a rotary turntable or, as shown in FIG. 5a, a rotatable circular ring 26, the rotation of the wafer, and hence the alignment of the wafer relative to the notch or flat, can be effected via the Teflon disks. In this way, in particular friction between the Teflon disks and the wafer is avoided, since no relative movement between the wafer and the disks occurs during the rotation.

For a centering of the wafer relative to a handling device independently of its diameter, it is also possible to linearly move the support pins 18 or the Teflon disks 22, i.e. the tilt plate.

In a further embodiment, the centered accommodation is achieved by synchronously moving the support elements of the first or the second support in one direction, as a function of the substrate diameter, after the tilting back of the first support.

FIG. 8 shows how the plate 14 of the apparatus 10 of FIG. 1 is tilted back after an alignment process. In the position shown in FIG. 8, the wafer 12 is partially accommodated on one of the support pins 18 and partially upon one of the Teflon disks 22. In this connection, during the tilting movement of the plate 14 a relative movement occurs between the encircled edge of the support pin 18 as well as the encircled edge of the Teflon disk 22, since the wafer is pressed toward the right by the abutment pins 24. This can lead to undesired particle formation as well as scratching of the wafer surface.

Therefore, with a non-illustrated preferred embodiment of the invention, the edges of the support pins 18 as well as of the Teflon disks 22, or of their entire support surface, are rounded off, thereby achieving a rolling of the wafer on the pins and disks. In particular, scratching due to the edges of the support pins and of the Teflon disks is avoided.

Figure 10:
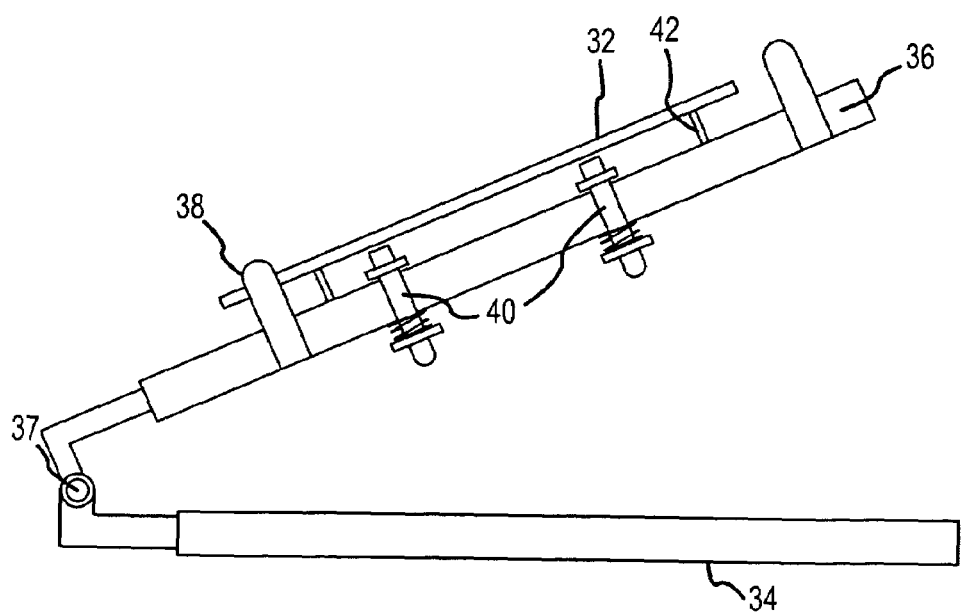
FIG. 10 a schematic side view of an apparatus pursuant to FIG. 9 in a tilted position.
Figure 11A:
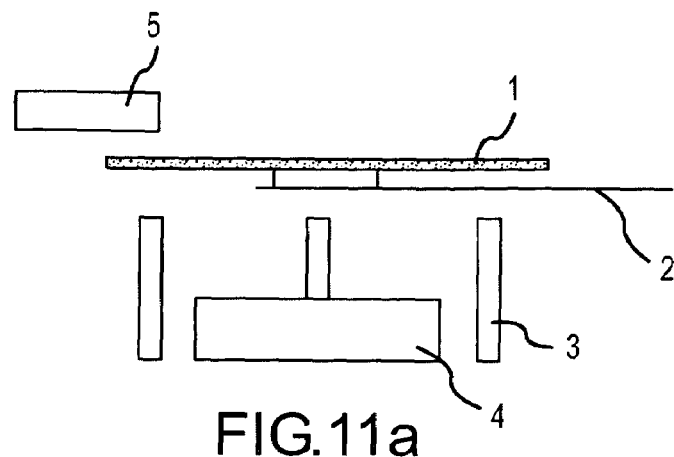
FIGS. 11a–d schematic side views of a conventional alignment apparatus illustrating the operating sequence of the apparatus.
Figure 11B:
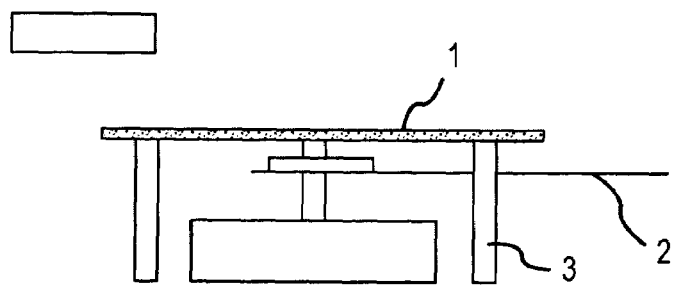
Figure 11C:
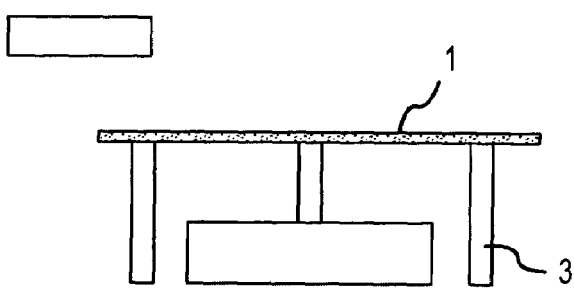
Figure 11D:
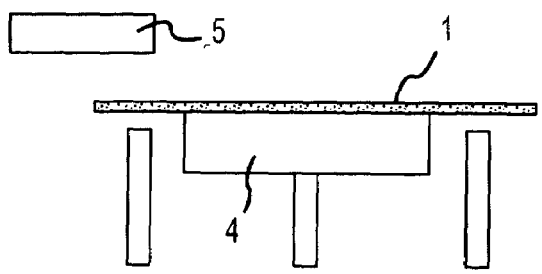
Figure 12A:
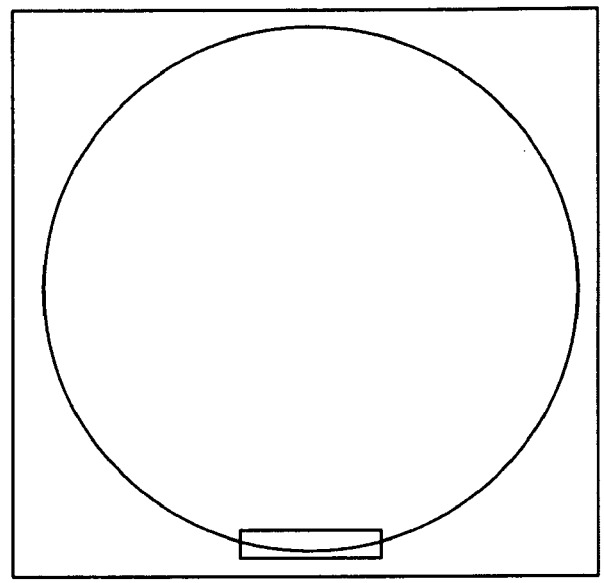
FIGS. 12a and b the results of a surface scanning prior to and after an alignment process on the conventional alignment apparatus.
Figure 12B:
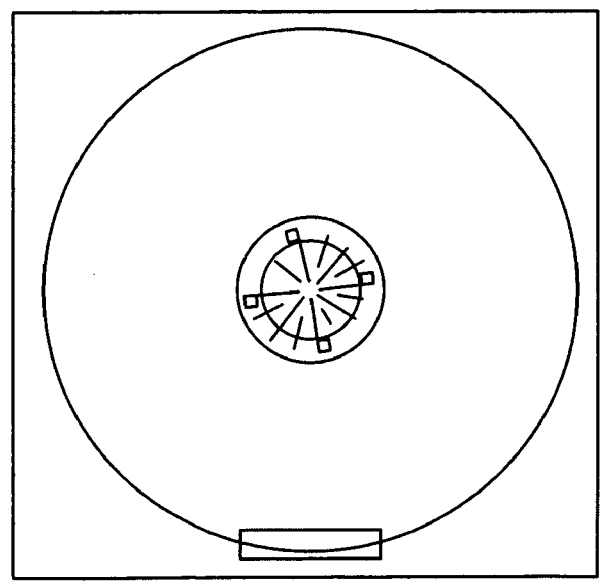

FIGS. 9 and 10 show an alternative apparatus 30 for the alignment of semiconductor wafers 32. The apparatus 30 has a base plate 34 and a tilt plate 36, which are pivotably interconnected by a swivel connection 37.

As with the first embodiment, rotatable abutment pins 38 are mounted on the tilt plate 36 and are rotatable about their central axis via a non-illustrated device. First support pins 40 as well as second support pins 42 are furthermore disposed on the tilt plate 36. Three first and three second support pins 40,42 are provided, which respectively form a three-point support for the semiconductor wafer 32.

The support pins 40 extend through the tilt plate 36 and are movable relative to the tilt plate 36. The movement of the support pins 40 relative to the tilt plate 36 is limited by an upper and a lower stop or limit disk 44,46 that is disposed above or below the tilt plate 36 respectively. Disposed between the lower limit disk 46 and an under-side of the tilt plate 36 is a spring 48 that biases the support pin 40 downwardly, i.e. away from the semiconductor wafer 32. The support pin 40 has a base or foot 50 that in a first position of the tilt plate 36, as shown in FIG. 9, is in contact with an upper side of the base plate 34, and presses the support pin 40 upwardly against the bias or tension of the spring through the plate 36. In this first position that is illustrated in FIG. 9, the support pins 40 form an essentially horizontal support plane that lies above a support plane formed by the support pins 42.

If the tilt plate 36 is tilted relative to the base plate 34, the feet 50 of the support pins 40 move away from the upper side of the base plate 34, and the support pins 40 move away from the substrate due to the bias of the spring. This movement is limited by the upper limit disk 44, as can be seen in FIG. 10. In this position, the support plane formed by the support pins 40 lies below the support plane formed by the support pins 42, so that the substrate now rests upon the support pins 42. In this position, the wafer 32 slides against the abutment pins 38 and, as with the first embodiment, is centered between them and is aligned as described previously.

After the alignment, the plate 36 is tilted back, as a result of which the feet 50 or the support pins 40 come into engagement with the base plate 34, and the pins press against the bias of the spring in the direction of the semiconductor wafer 32. The feet 50 of the support pins 40 are rounded off so that during the tilting back they roll upon the base plate and prevent a canting of the pins within the tilt plate 36. Since the support pins 40 are tilted along with the tilt plate 36, their support surfaces are always parallel to the wafer surface, thereby essentially precluding a placement of the wafer upon only one pin edge as well as a relative movement between the support pins 40 and the wafer 32 during the tilting back.

Although the invention was described with the aid of preferred embodiments, the present invention is not limited thereto. In particular, it is possible to eliminate the support pins 18 and 40 of the embodiment, as a result of which the semiconductor wafer would be placed directly upon the Teflon disk 22 or upon the support pins 42. It is also not absolutely necessary to provide a tiltable plate. An inclined support plane can also be achieved by a relative movement in a vertical direction between the support elements. It is furthermore also possible to place the semiconductor wafers upon a stationary support device that forms a plane that is inclined relative to the horizontal. In this case, it would be necessary to provide a wafer-handling device that brings the wafers into the inclined position and deposits them upon the support device. The problem of particle accumulation upon the wafer is reduced in that a particle-suction device is provided that in particular in the tilted state of the plate suctions off particles found on the wafer in a downward direction.

The specification incorporates by reference the disclosure of German priority document 199 57 758.7 filed Dec. 1, 1999 and international priority document PCT/EP00/11955 filed 29 Nov. 2000.

The present invention is, of course, in no way restricted to the specific disclosure of the specification and drawings, but also encompasses any modifications within the scope of the appended claims.

What is claimed is:

1. An apparatus for aligning disk-shaped substrates, comprising:
   an alignment detection unit;
   at least one movable first support for receiving a substrate, wherein said at least one first support forms a support plane;
   a device for tilting said at least one first support relative to a horizontal in order to bring said support plane into a position that is inclined relative to said horizontal;
   a second support that forms an essentially horizontal support and serves to receive said substrate, wherein said at least one first support and said second support are movable relative to one another in such a manner that a substrate resting on said second support in an essentially horizontal orientation is raised from said second support and moved into a position that is inclined relative to said horizontal when said first support is moved to a tilted position;
   abutment means against which said substrate is movable as a consequence of an inclined position thereof; and
   a rotation device for rotating said substrate.

2. An apparatus according to claim 1, wherein said at least one first support is provided with at least two first support elements that form said support plane.

3. An apparatus according to claim 2, wherein said first support elements at least in a support region thereof, are provided with a material having a low friction.

4. An apparatus according to claim 3, wherein said support region of said support elements is rounded off.

5. An apparatus according to claim 1, wherein said abutment means is tiltable.

6. An apparatus according to claim 2, wherein said abutment means is provided with at least two abutment pins that are spaced from one another.

7. An apparatus according to claim 6, wherein at least one of said abutment pins is rotatably mounted.

8. An apparatus according to claim 7, wherein said abutment pins are synchronously rotated.

9. An apparatus according to claim 1, and further comprising means for controlling the rotation of said rotation device as a function of an alignment of said substrate as determined by said detection unit.

10. An apparatus according to clam 6, wherein at least one of said support elements and said abutment pins are disposed on a common plate.

11. An apparatus according to claim 10, wherein said common plate is tiltable.

12. An apparatus according to claim 10, wherein said second support is provided with at least two second support elements that form said horizontal support.

13. An apparatus according to claim 12, wherein said second support elements are stationary.

14. An apparatus according to claim 12, wherein said plate is provided with openings, and wherein said second support elements extend through said openings.

15. An apparatus according to claim 14, wherein said second support elements are movable together with said common plate and relative thereto.

16. An apparatus according to claim 15, wherein said second support elements are biased in the direction facing away from said substrate.

17. An apparatus according to claim 1, wherein a device is provided for measuring a diameter of said substrate.

18. An apparatus according to claim 6, and further comprising a device for measuring a diameter of said substrate, and means for adjustably setting the spacing between said abutment pins as a function of a diameter of said substrate.

19. An apparatus according to claim 2, and further comprising means for rotating said first support elements about a common center point.

20. An apparatus according to claim 2, wherein said first support elements are disposed upon a rotatable element.

21. An apparatus according to claim 1, wherein a substrate-handling device is provided for transporting said substrate and wherein movement of said handling device is controllable as a function of a diameter of said substrate.

22. An apparatus according to claim 12, and further comprising means for moving at least one of said first and said second support elements in one direction as a function of a diameter of said substrate.

23. A method of aligning disk-shaped substrates, including the steps of:
placing the substrate upon a second support of an alignment apparatus, wherein said second support forms an essentially horizontal plane;
moving a movable first support of said alignment apparatus into a position that is inclined relative to the horizontal for the purpose of raising said substrate from said second support and moving said substrate into a position that is inclined relative to the horizontal and in which, due to said incline said substrate rests against at least one abutment;
rotating said substrate into a prescribed rotated position; and
monitoring said rotated position with a detection unit.

24. A method according to claim 23, and further comprising moving in common at least one of said supports and said at least one abutment in common.

25. A method according to claim 23, wherein rotating said substrate into a prescribed rotated position included rotating said substrate by rotating at least one abutment element of said at least one abutment.

26. A method according to claim 25, and further comprising rotating at least two abutment elements that are spaced from one another.

27. A method according to claim 25, wherein rotating said substrate into a prescribed rotated position includes rotating said substrate as a function of an alignment of said substrate as determined by said detection unit.

28. A method according to claim 26, and further comprising determining a diameter of said substrate.

29. A method according to claim 28, and further comprising adjusting the spacing between said abutment elements as a function of said diameter of said substrate.

30. A method according to claim 23, wherein said substrate is rotated by rotating said first support.

31. A method according to claim 28, wherein a substrate-handling device is provided, and further comprising controlling the movement of said substrate-handling device as a function of said diameter of said substrate.

32. A method according to claim 28, and further comprising moving at least one of said first support and said second support in one direction as a function of said substrate diameter.

33. A method according to claim 23, and further comprising tilting said first support into said position that is inclined relative to the horizontal.

34. An apparatus for aligning disk-shaped substrates, comprising:
an alignment detection unit;
a first support for supporting a substrate thereon;
a tilting device for moving said first support between a start position and a tilted position at which said first support is tilted relative to a horizontal, whereby a substrate supported on said first support is inclined relative to said horizontal;
a second support for supporting said substrate thereon, wherein a transfer of said substrate between said first support and said second support is effected by movement of said first support and said second support relative to one another in a manner such that the position of the respective one of said first support and said second support on which said substrate is initially supported is changed from a relatively higher position in which the respective one of said first support and said second support on which said substrate is initially supported supports said substrate above the other of said first support and said second support to a relatively lower position in which the respective one of said first support and said second support on which said substrate is initially supported is below the other of said first support and said second support, whereupon the other of said first support and said second support intercepts and takes over support of said substrate from the respective one of said first support and said second support on which said substrate is initially supported during the change of position of the respective one of said first support and said second support on which said substrate is initially supported from said relatively higher position to said relatively lower position;
abutment means against which said substrate is movable as a consequence of an inclined position thereof; and
a rotation device for rotating said substrate.

35. An apparatus according to claim 34, wherein said first support and said second support are disposed relative to one another such that movement of said first support by said tilting device from said start position to said tilted position effects the change of position of the respective one of said first support and said second support on which said substrate is initially supported from said relatively higher position to said relatively lower position, whereupon, in the event that the respective one of said first support and said second support on which said substrate is initially supported is said second support, said first support intercepts and thereafter supports said substrate during movement of said first support by said tilting device from said start position to said tilted position due to the resulting change of position of said second support from a position in which said second support is relatively higher than said first support when said first support is in said start position to a position in which said second support is relatively lower than said first support when said first support is in said tilted position.

* * * * *